United States Patent [19]

Jones et al.

[11] Patent Number: 5,055,652
[45] Date of Patent: Oct. 8, 1991

[54] LASER SOLDERING OF FLEXIBLE LEADS

[75] Inventors: Marshall G. Jones, Scotia; Allen W. Case, Jr., Amsterdam, both of N.Y.

[73] Assignee: General Electric Company, Schenectady, N.Y.

[21] Appl. No.: 591,327

[22] Filed: Oct. 1, 1990

[51] Int. Cl.⁵ .............................................. B23K 26/00
[52] U.S. Cl. ............................................... 219/121.64
[58] Field of Search ...................... 219/121.63, 121.64, 219/121.12, 121.20

[56] References Cited

U.S. PATENT DOCUMENTS

| | | | |
|---|---|---|---|
| 4,564,736 | 1/1986 | Jones et al. | 219/121 L |
| 4,681,396 | 7/1987 | Jones | 350/96.18 |
| 4,799,755 | 1/1989 | Jones | 350/96.18 |
| 4,877,175 | 10/1989 | Jones et al. | 228/102 |
| 4,978,835 | 12/1990 | Luijtjes et al. | 215/121.64 |

OTHER PUBLICATIONS

Lea, "A Scientific Guide to Surface Mount Technology", Electrochemical Publications Limited, 1988 (pp. 20–22).

"Microelectronics Packaging Handbook", edited by Tummala et al., Van Nostrand Reinhold, 1989 (pp. 409–435).

*Primary Examiner*—C. L. Albritton
*Attorney, Agent, or Firm*—James R. McDaniel; James C. Davis, Jr.; Paul R. Webb, II

[57] ABSTRACT

A method for soldering a lead to a pad having a solder plate formed thereon is described. In one embodiment of the method, a tape is disposed between the lead and a laser source, and the method includes the steps of aligning the lead with the solder plated pad, transmitting a beam from the laser source through the tape and to a location where a solder joint is to be formed, and the beam heating the solder plate thereby causing reflow of the solder plate to form a solder joint.

18 Claims, 5 Drawing Sheets

LASER SOLDERING OF FLEXIBLE LEADS

BACKGROUND OF THE INVENTION

1. Field of the Invention

The present invention generally relates to soldering leads, and more particularly, relates to laser soldering microelectronic leads.

2. Related Art

Mounting microelectronic devices on printed circuit boards has become a popular method for packaging circuits for units such as computers and control systems. Known methods for mounting microelectronic devices on printed circuit boards include surface mount and through-hole mount methods. Particularly, in surface mount methods, a microelectronic device is disposed on a first surface of a printed circuit board, and leads of the device are soldered to and form connections with pads deposited on the first surface of the circuit board. The connections are made on the same surface, i.e., the first surface, on which the microelectronic device is disposed. With through-hole mount methods, a microelectronic device is disposed on a first surface of a printed circuit board and leads of the device are aligned with and passed through openings formed in the circuit board. Then, the leads of the device are soldered in the opening and form connections with conductors disposed on the printed circuit board.

With surface mount devices, the number of leads extending from a microelectronic chip may exceed three hundred, for example. Lining the leads up with corresponding pads on the printed circuit board, and then maintaining the alignment during a soldering process is a difficult, and time consuming, task.

To facilitate aligning and maintaining the leads in position relative to pads on the printed circuit board, a process generally known as Tape-Automated Bonding (TAB) has been implemented. A microelectronic chip, its corresponding leads, and polyimide tape typically compose a TAB device. The leads are bonded to the tape, and then the chip is bonded to an inner portion of the each lead. Then, an outer portion of the tape is etched away so that the leads extend from an outer surface of the tape. The leads from the TAB device are supported, at least partially, by the tape to facilitate aligning the leads with solder plated pads. The leads are then soldered to corresponding printed circuit board pads.

Particularly, at the location where the tape has been etched away, the leads of the chip are exposed. These exposed leads are aligned with solder plated pads formed on the corresponding printed circuit board conductors, and the leads are then soldered using, for example, a hot blade. The hot blade is used for conductive heating to reflow solder plates on the solder pads. The hot blade is also utilized to hold the leads in contact with their mating pads while the solder is reflowed.

Lead hold down is a common problem in most solder processes, and the problem is amplified when soldering flexible leads, which are typical in TAB devices. In known TAB processes, the exact point where the soldering is to occur is the exact point where the leads no longer are supported or held by the tape as a result of the tape etching process. With known TAB approaches, if the tape were not removed, utilizing a hot blade would result in burning the tape and possibly damaging the chip due to excessive heat.

Other than using a hot blade, it is known to use a laser beam in a TAB process to reflow the solder. Particularly, using known laser-TAB methods, an outer portion of the tape is removed via an etching process, the leads are aligned with corresponding solder pads, and a laser beam is utilized to reflow the solder. Known laser tools which could be utilized in a laser-TAB process are described in commonly assigned U.S. Pat. No. 4,564,736, entitled "Industrial Hand Held Laser Tool and Laser System", commonly assigned U.S. Pat. No. 4,681,396, entitled "High Power Laser Energy Delivery System", and commonly assigned U.S. Pat. No. 4,799,755, entitled "Laser Materials Processing with a Lensless Fiber Optic Output Coupler".

In known laser-TAB processes, however, the problem of lead hold down is prevalent because the leads are unsupported by the tape at the location of soldering. At least with the hot blade method, the leads can be held down with the blade. Further, fumes result when utilizing a laser beam to reflow the solder, and the fumes can coat the laser beam delivery optics thereby deteriorating operation of the laser device.

SUMMARY OF THE INVENTION

The present invention provides a method for soldering microelectronic lead connections which not only protects beam delivery optics of a laser source from solder/flux vapors, but also permits implementation of easier hold down techniques, such as using mechanical clamps for holding the leads in a desired position. Particularly, rather than etching the tape to expose a portion of each lead, the tape is left in place, i.e., the tape is disposed over the leads. The TAB device is then placed on a corresponding printed circuit board, and the leads are aligned with corresponding conductors/solder pads. A mechanical coupler or clamp may be used to hold the TAB device in the desired position. A Nd(neodymium):YAG (yttrium aluminum garnet) laser source beam is then utilized to reflow the solder. Particularly, the tape is disposed between the laser source and leads. A beam emitted from the laser source is transmitted through the tape and couples with and heats the leads sufficiently to cause reflow of the solder plates.

The tape supports the leads to facilitate and maintain alignment. The tape also blocks vapor emitted from the solder during the reflow operation thereby protecting the optical components of the laser system from solder/flux vapors. The present method therefore provides protection of the beam delivery optics and permits implementation of easier hold down methods for the leads.

BRIEF DESCRIPTION OF THE DRAWINGS

These and other objects of the present invention, together with further features and advantages thereof, will become apparent from the following detailed specification when read together with the accompanying drawings, in which.

DETAILED DESCRIPTION OF THE DRAWINGS

Figure 1:
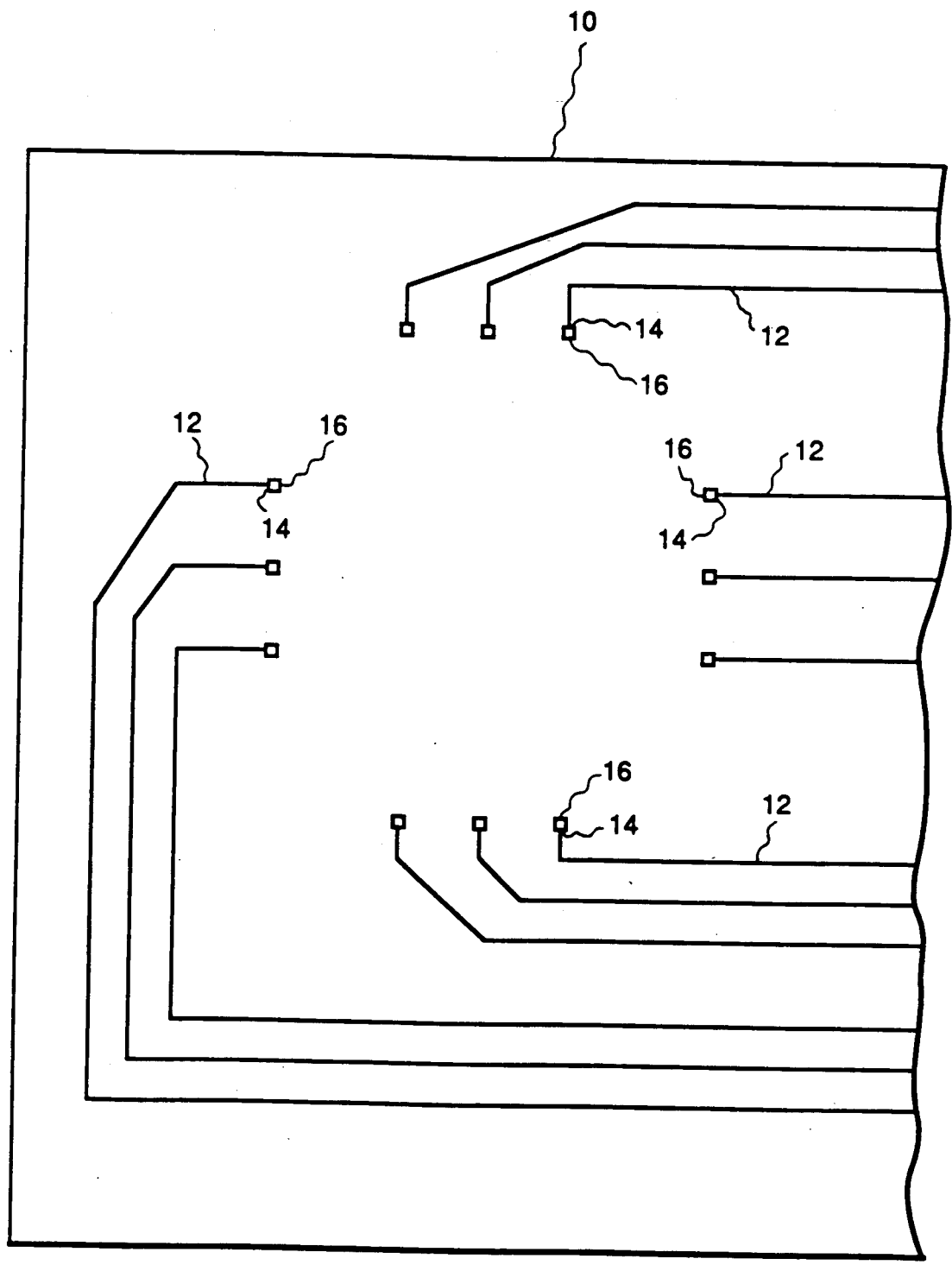
FIG. 1 is an enlarged view of a portion of a printed circuit board.

Referring now more particularly to the drawings, FIG. 1 illustrates a portion 10 of a printed circuit board. As shown in FIG. 1, the circuit board includes conductors 12 which may be formed on/within board 10 using well-known techniques. Also using well-known techniques, each end portion 14 of each conductor 12 has a solder pad 16 formed thereon. Each solder pad is plated with solder and is disposed so that it may mate with a lead of a TAB device, such as a TAB device 20 as shown in FIG. 2.

Figure 2:
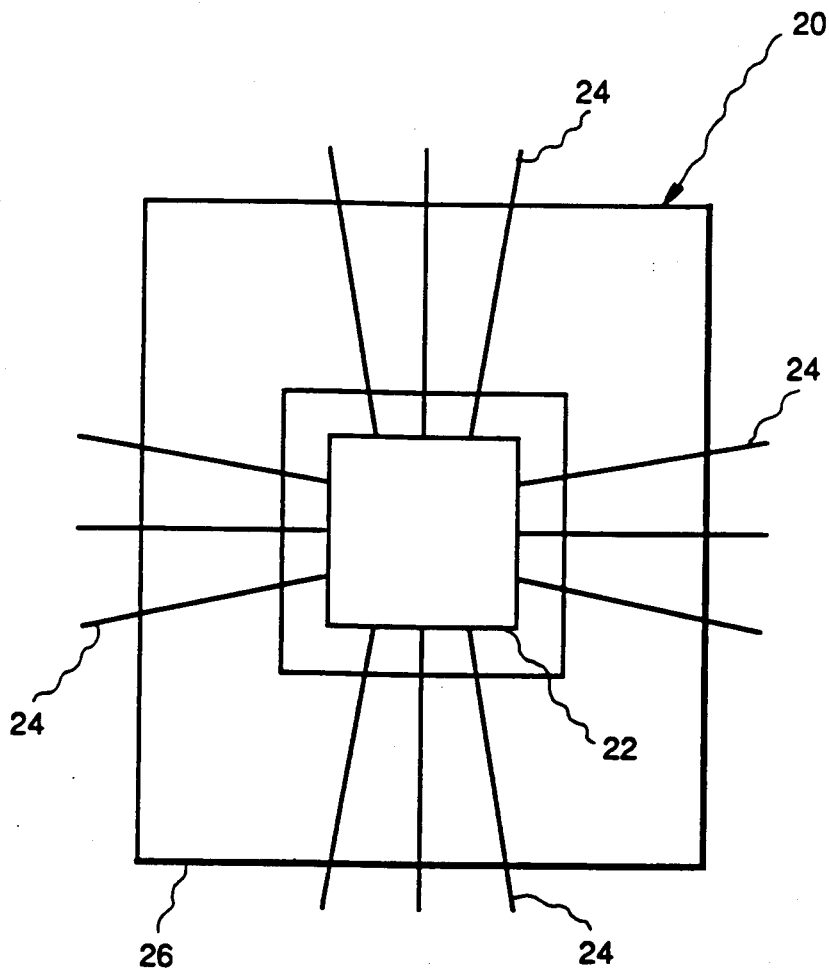
FIG. 2 is an enlarged bottom view of a typical TAB device.

More particularly, as shown in FIG. 2, TAB device 20 includes a microelectronic chip 22 having leads 24 extending therefrom. It should be understood that a typical TAB device has more leads than the number of leads illustrated in the TAB device shown in FIG. 2. Tape 26, such as the polyimide tape commercially known as Kapton and available from DuPont, is bonded to and supports leads 24 in a well-known manner. As illustrated in FIG. 2, tape 26 has been etched so that a portion of each lead 24 extends from the outer surface of the tape.

The TAB device shown in FIG. 2 is constructed and used in accordance with well known methods. An illustration of device 20 is provided primarily for background purposes and to facilitate an understanding of the present invention. As should be apparent from FIGS. 1 and 2, TAB device 20 could be disposed on printed circuit board portion 10 illustrated in FIG. 1, and the leads of TAB device 20 would then be aligned with corresponding solder pads. The TAB device would be disposed so that the leads are between the tape and the printed circuit board surface, i.e., FIG. 2 is a bottom view of the TAB device. With the TAB device shown in FIG. 2, and once disposed on printed circuit board 10 as hereinbefore described, a hot blade could be utilized to reflow the solder plated pad thereby establishing electrical connections between the TAB device lead and the printed circuit board conductors.

Figure 3:
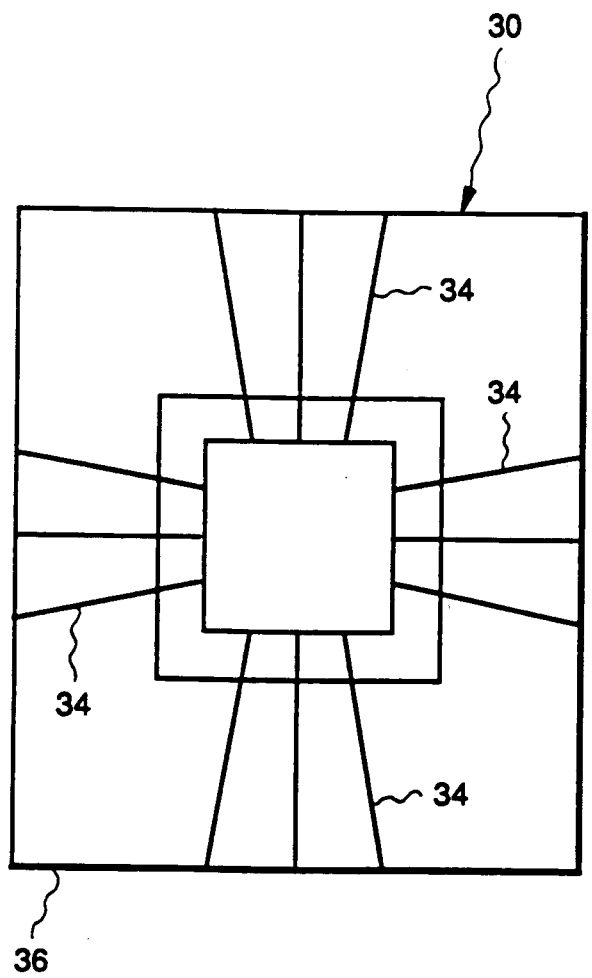
FIG. 3 is an enlarged bottom view of a TAB device which could be utilized in the present method.

FIG. 3 illustrates a TAB device 30 which could be used in practicing the present method. Particularly, TAB device 30 includes a microelectronic chip 32, leads 34 extending from chip 32, and tape 36. Tape 36 extends to the end of each lead 34. In TAB device 20 shown in FIG. 2, tape 26 was etched so that an end portion of each lead is exposed, i.e., an end portion of each lead is not bonded to the tape. With the TAB device shown in FIG. 3, however, the end portion of each lead is bonded to the tape.

It is contemplated that rather than terminating at an end portion of each lead, tape 36 could even extend beyond the end of each lead. Further, a second tape portion (not shown) could be utilized to "sandwich" the leads between two layers of tape. The second tape portion would have to be of a length so that a portion of one side of each lead is exposed so that the lead can be brought into contact with the solder plated pads, i.e., the end portion of the lead could not be totally enclosed by tape.

TAB device 30, just as TAB device 20, may be disposed on portion 10 of the printed circuit board as shown in FIG. 1. The TAB device leads would then be aligned with the solder plated pads. Note that FIG. 3 is a bottom view of the TAB device and the chip leads would be disposed between the tape and the printed circuit board. Once aligned in the above described manner, a laser solder process as described below would be performed.

Figure 4:
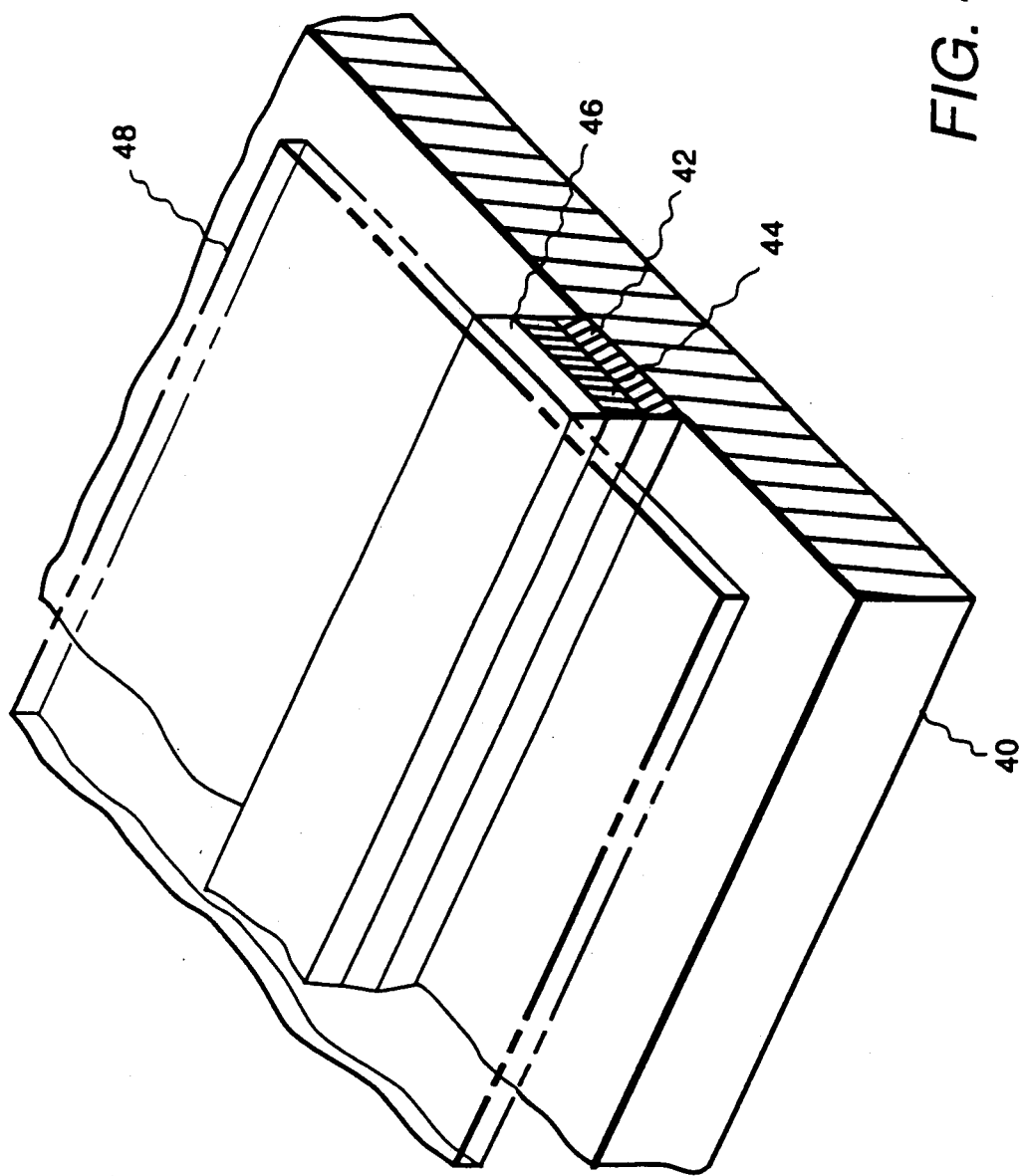
FIG. 4 is an enlarged view of alignment of TAB components and a portion of a printed circuit board in accordance with the present process.

Specifically, FIG. 4 is an enlarged view of a printed circuit board 40, a copper pad 42 and a solder plated plate 44, all shown in cross-section. A tinned copper lead 46 bonded to tape 48 is disposed on solder plate 44. Lead 46 and tape 48 are part of a TAB device. Tape 48 is illustrated in phantom in order to facilitate a view of the material layers. Once aligned in the manner illustrated, a mechanical clamp, or coupler, could be utilized to maintain the TAB device in the desired position.

Figure 5:
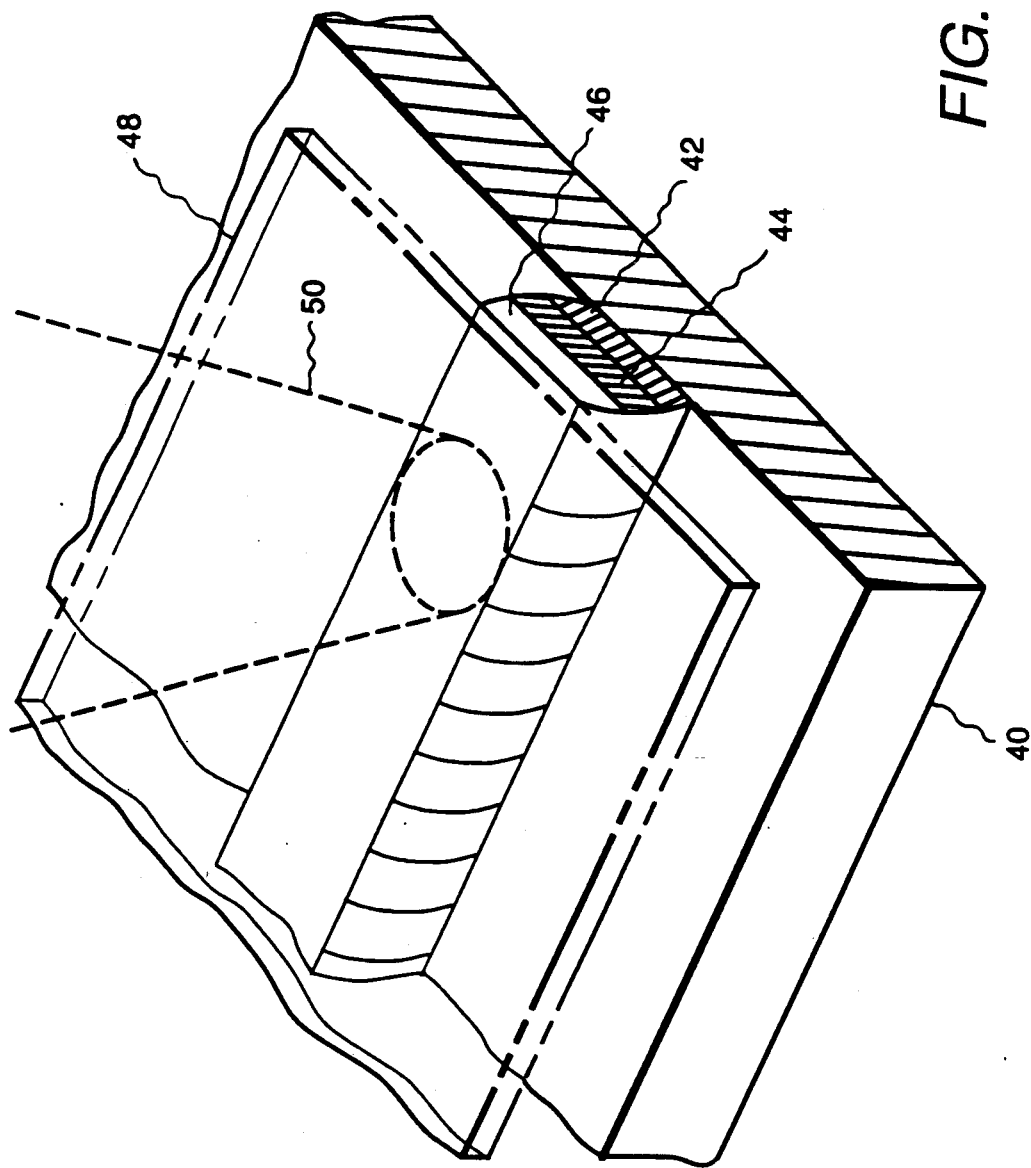
FIG. 5 is an illustration of the components shown in FIG. 4 and further including a schematic illustration of a laser beam impinging thereon to bring about solder reflow.

Subsequent to alignment, and as illustrated in FIG. 5, a laser beam 50 emitted from a laser beam source (not shown) is directed to a location where a solder joint is to be formed. The laser source, for example, may be any of the devices described in U.S. Pat. Nos. 4,564,736, 4,681,396, or 4,799,755, as hereinbefore mentioned. The laser beam is transmitted through the tape and couples with and heats the copper leads sufficiently enough to cause reflow of the solder plate as shown in FIG. 5.

The tape supports the leads to facilitate and maintain alignment of each lead with a corresponding solder plated pad. The tape also blocks vapor emitted from the solder during the reflow operation thereby protecting optical components of the laser system from solder/flux vapors. The present method therefore provides protection of the beam delivery optics and permits implementation of easier hold down methods, e.g., using a mechanical clamp, for the leads.

In an actual implementation of the present invention, the leads of a TAB device that were soldered were 1 by 4 mils in cross section and were soldered to mating pads when solder reflow was performed with laser energy transmitted through a 1 mil thick Kapton tape strip. The range of laser power used was 5-10 watts. The Kapton strip covered and was in contact with the tin copper leads. It should be understood, of course, that tape other than Kapton could be utilized in accordance with the present invention. Some polyimide tapes, however, may absorb the Nd:YAG laser beam and would prevent through-polyimide processing. Therefore, the tape selected must transmit, and preferably efficiently transmit, a corresponding beam which is being used to affect soldering. The Nd:YAG beam is of 1.06 micrometer wavelength and other tapes transmit such wavelength beams.

It should also be understood that a laser source other than a Nd:YAG source could be utilized. If an emitted beam from a laser beam source can be substantially transmitted through the tape at a power level sufficient to bring about solder reflow, the laser beam source can be utilized.

By providing that the tape remains disposed over the leads during the soldering process, the leads are better held in position relative to the pads, and registration and coplanarity of the leads and pads is facilitated. Particularly, a mechanical holder could be used to maintain the TAB in a selected position. Further, during materials processing, the polyimide tape prevents solder/flux vapors from coating the laser beam delivery optics, therefore eliminating the problem associated with the known systems.

While a preferred embodiment of the present invention has been illustrated and described herein, numerous modifications, changes, variations, substitutions and equivalents, in whole or in part, will now occur to those skilled in the art without departing from the spirit and scope contemplated by the invention. Accordingly, it is intended that the invention herein be limited only by the scope of the appended claims.

What is claimed is:

1. A method comprising the steps of:
   aligning a lead with a solder plated pad; and
   transmitting a beam through a tape bonded to the lead, the tape being disposed between the lead and a laser source emitting the beam, the beam being directed to a location where a solder joint is to be formed and heating the solder plated pad thereby causing reflow of solder plate disposed on the pad.

2. A method in accordance with claim 1 wherein the tape prevents solder/flux vapors from substantially coating optical components of the laser source.

3. A method in accordance with claim 1 further comprising the step of mechanically maintaining the lead in alignment with the solder plated pad while transmitting the beam from the laser source.

4. A method in accordance with claim 1 wherein the tape and the lead form part of a tape automated bonding device.

5. A method in accordance with claim 1 wherein the tape is a polyimide tape.

6. A method in accordance with claim 1 wherein the laser source is an ND:YAG laser source which emits a laser beam having a wavelength of 1.06 micrometers.

7. A method for soldering a lead to a pad having a solder plate deposited thereon, a tape being disposed between the lead and a laser source, said method comprising the steps of:
   aligning the lead with the solder plated pad;
   transmitting a beam from the laser source through the tape and to a location where a solder joint is to be formed; and
   the beam heating the solder plate thereby causing reflow of the solder plate to form a solder joint.

8. A method in accordance with claim 7 wherein the tape prevents solder/flux vapors from substantially coating optical components of the laser source.

9. A method in accordance with claim 7 further comprising the step of mechanically maintaining the lead in alignment with the solder plated pad while transmitting the beam from the laser source.

10. A method in accordance with claim 7 wherein the tape and the lead form part of a tape automated bonding device.

11. A method in accordance with claim 7 wherein the tape is a polyimide tape.

12. A method in accordance with claim 7 wherein the laser source is an Nd:YAG laser source which emits a laser beam having a wavelength of 1.06 micrometers.

13. A method for soldering leads of a tape automated bonding device to pads having solder plates formed thereon, the solder plated pads being formed on a printed circuit board, tape of the tape automated bonding device being disposed between each lead and a laser source, said method comprising the steps of:
   aligning the leads with the solder plated pads;
   transmitting a beam from the laser source through the tape and to a location where solder joints are to be formed; and
   the beam heating the solder of the solder plated pad thereby causing reflow of the solder plates to form solder joints.

14. A method in accordance with claim 13 wherein the tape prevents solder/flux vapors from substantially coating optical components of the laser source.

15. A method in accordance with claim 13 further comprising the step of mechanically maintaining the leads in alignment with the solder plated pads while transmitting the beam from the laser source.

16. A method in accordance with claim 13 wherein the tape and the leads form part of the tape automated bonding device.

17. A method in accordance with claim 13 wherein the tape is a polyimide tape.

18. A method in accordance with claim 13 wherein the laser source is an Nd:YAG laser source which emits a laser beam having a wavelength of 1.06 micrometers.

* * * * *